United States Patent
Oshima et al.

(10) Patent No.: US 8,173,212 B2
(45) Date of Patent: May 8, 2012

(54) METHOD FOR MANUFACTURING CARBON NANO TUBE

(75) Inventors: Hisayoshi Oshima, Obu (JP); Shinichi Mukainakano, Nagoya (JP)

(73) Assignee: DENSO CORPORATION, Kariya (JP)

( * ) Notice: Subject to any disclaimer, the term of this patent is extended or adjusted under 35 U.S.C. 154(b) by 1036 days.

(21) Appl. No.: 12/081,800

(22) Filed: Apr. 22, 2008

(65) Prior Publication Data

US 2009/0011128 A1 Jan. 8, 2009

(30) Foreign Application Priority Data

Jun. 13, 2007 (JP) .................. 2007-156610

(51) Int. Cl.
*C23C 16/00* (2006.01)

(52) U.S. Cl. .................. 427/255.28; 977/843
(58) Field of Classification Search .......... None
See application file for complete search history.

(56) References Cited

U.S. PATENT DOCUMENTS

| | | | |
|---|---|---|---|
| 2005/0013762 A1 | 1/2005 | Kurachi et al. | |
| 2005/0089467 A1* | 4/2005 | Grill et al. | 423/447.3 |
| 2007/0037370 A1* | 2/2007 | Suekane et al. | 438/584 |

FOREIGN PATENT DOCUMENTS

| | | |
|---|---|---|
| JP | A-2006-21957 | 1/2006 |
| JP | A-2006-62924 | 3/2006 |

OTHER PUBLICATIONS

Geohegan et al., "In situ growth rate measurements and length control during chemical vapor deposition of vertically aligned multiwall carbon nanotubes", Sep. 2008, Applied Physics Letters, vol. 83, No. 9, p. 1851-1853.*
Brukh et al., "Mechanism of carbon nanotube growth by CVD", Apr. 22, 2006, "Chemical Physics Letters" 424 (2006), pp. 126-132.*
Osamu Suekane, et al., "Rapid growth of multi-layered carbon nano tube having a brush shape manufactured by thermal CVD method", *Japanese Journal of Applied Physics*, vol. 73, No. 5, pp. 615-619, May 10, 2004. (partial English translation attached).
Notice of Reasons for Refusal mailed on Dec. 15, 2009 issued from the Japanese Patent Office in the corresponding Japanese patent application No. 2007-156610 (and English translation).
Suekane, Osamu et al., *Development of Rapid Growth Technique for Vertically Aligned Carbon Nanotubes*, Taiyo-nissan-gihou No. 23 (2004), pp. 8-13.

* cited by examiner

*Primary Examiner* — Matthew Daniels
*Assistant Examiner* — Lisa Herring
(74) *Attorney, Agent, or Firm* — Posz Law Group, PLC

(57) ABSTRACT

A method for manufacturing a carbon nano tube by a CVD method includes: supplying a carbon atom to a catalyzer for forming the carbon nano tube; and controlling an amount of carbon supply with time. In this method, super saturation of the carbon atom in the catalyzer is controlled appropriately. Thus, a caulking layer is prevented from being formed on the catalyzer, and therefore, the carbon nano tube having a sufficient length is obtained.

1 Claim, 3 Drawing Sheets

# METHOD FOR MANUFACTURING CARBON NANO TUBE

CROSS REFERENCE TO RELATED APPLICATION

This application is based on Japanese Patent Application No. 2007-156610 filed on Jun. 13, 2007, the disclosure of which is incorporated herein by reference.

FIELD OF THE INVENTION

The present invention relates to a method for manufacturing a carbon nano tube.

BACKGROUND OF THE INVENTION

A carbon nano tube (i.e., CNT) is synthesized by an arc discharge method, a laser vaporization method, or a chemical vapor deposition method. In view of productivity, the CVD method becomes mainstream.

The CVD method is classified to a fluidized bed CVD method and a fixed bed CVD method. The fluidized bed CVD method is such that raw material gas including carbon for synthesizing the CNT and a CNT growth catalyzer for functioning as reacting origin are introduced into a heated reactor at the same time. The fixed bed CVD method is such that a substrate is arranged in a heated reactor, in which a catalyzer is arranged, and then, raw material gas is introduced into the heat reactor.

A fixed bed CVD device includes a raw material gas supplier, a carrier gas supplier, an electric furnace for generating heat, a substrate for holding the catalyzer, and a reactor tube. If necessary, the fixed bed CVD device further includes a vacuum pump for pumping air from the reactor tube, which is arranged on a downstream side of the reactor tube. This type of CVD device is disclosed in, for example, JP-2006-62924. In this device, the CNT can be synthesized on the substrate. In an initial synthesizing step, the length of the CNT becomes large in proportion to a process time. However, the length of the CNT is saturated after the process time of a few minutes to a few tens of minutes has passed. Thus, the maximum length of the CNT is a few hundreds microns to a few millimeters. Accordingly, the CNT cannot be synthesized to have the length longer than the maximum length.

To form the CNT having large length, a two-step synthesis method is disclosed in, for example, JP-2005-29414 corresponding to USP Application Publication No. 2005/0013762.

However, in the two-step synthesis method, caulking phenomenon may occur under some conditions of raw material gas. The caulking phenomenon is such that a carbon film coats the surface of the catalzser. Here, the carbon film is not made of the CNT. When the carbon film covers the whole surface of the catalyzer, carbon supply to the catalyzer stops, so that the catalyzer does not function, i.e., the catalyzer is deactivated. Thus, the growth of the CNT stops.

SUMMARY OF THE INVENTION

In view of the above-described problem, it is an object of the present disclosure to provide a method for manufacturing a carbon nano tube.

According to a first aspect of the present disclosure, a method for manufacturing a carbon nano tube by a CVD method includes: supplying a carbon atom to a catalyzer for forming the carbon nano tube; and controlling an amount of carbon supply with time. In this method, super saturation of the carbon atom in the catalyzer is controlled appropriately. Thus, a caulking layer is prevented from being formed on the catalyzer, and therefore, the carbon nano tube having a sufficient length is obtained.

According to a second aspect of the present disclosure, a method for manufacturing a carbon nano tube by a CVD method includes: supplying a raw material gas into a reactor, the raw material gas providing a carbon supply source; and controlling at least one of a concentration and a flow rate of the raw material gas. In this method, super saturation of the carbon atom in the catalyzer is controlled appropriately. Thus, a caulking layer is prevented from being formed on the catalyzer, and therefore, the carbon nano tube having a sufficient length is obtained.

According to a third aspect of the present disclosure, a method for manufacturing a carbon nano tube by a CVD method includes: forming a catalyzer on a substrate, wherein the carbon nano tube is formed with using the catalyzer; arranging the substrate with the catalyzer in a reactor; heating the substrate to be a synthesis temperature; supplying a raw material gas into the reactor, the raw material gas providing a carbon supply source; and controlling at least one of a concentration and a flow rate of the raw material gas. The controlling at least one of the concentration and the flow rate includes: setting the concentration to a first concentration or setting the flow rate to a first flow rate at a first step of synthesis of the carbon nano tube; and setting the concentration to a second concentration or setting the flow rate to a second flow rate at a second step of synthesis of the carbon nano tube. The second concentration is smaller than the first concentration, and the second flow rate is smaller than the first flow rate. The second step is performed after the first step. In this method, super saturation of the carbon atom in the catalyzer is controlled appropriately. Thus, a caulking layer is prevented from being formed on the catalyzer, and therefore, the carbon nano tube having a sufficient length is obtained.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
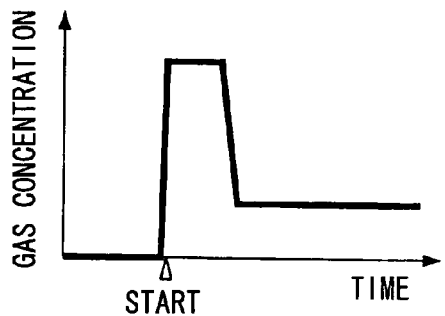
FIG. 1 is a graph showing a control profile of raw material gas.
Figure 2A:
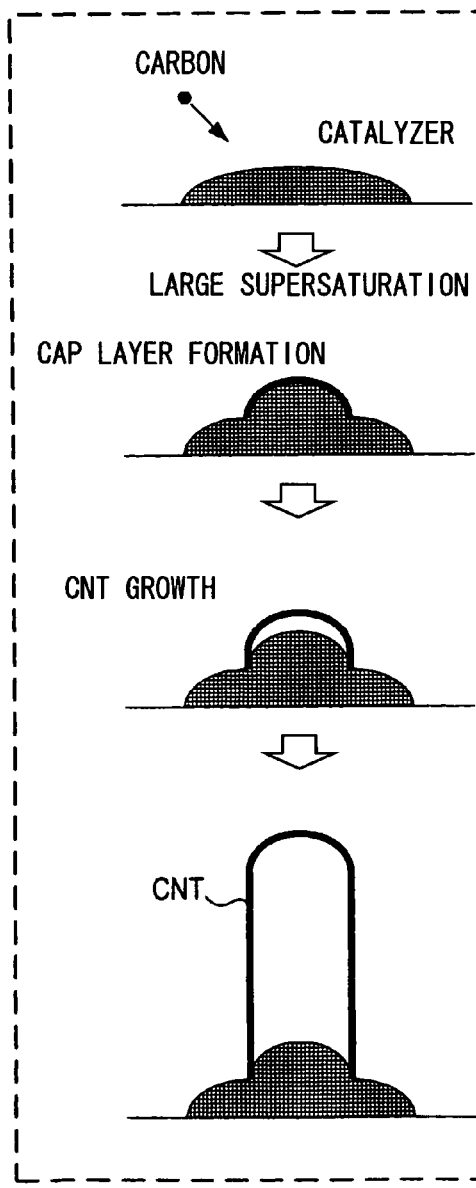
FIGS. 2A to 2C are schematic views showing various CNT forming states.

The inventors have studied about a forming state of a CNT. FIG. 1 shows a relationship between time and raw material gas concentration when the CNT is synthesized. In an initial synthesis process, raw material gas having high gas concentration is supplied to a catalyzer. In this case, a large amount of carbon atoms is introduced to the catalyzer so that the catalyzer becomes super saturated with high carbon concentration in the catalyzer. As shown in FIG. 2A, in case of large super saturation, a carbon atom separates out on the surface of the catalyzer from the inside of the catalyzer. Thus, a cap layer as an initial state of the CNT is formed on the catalyzer.

Figure 2B:
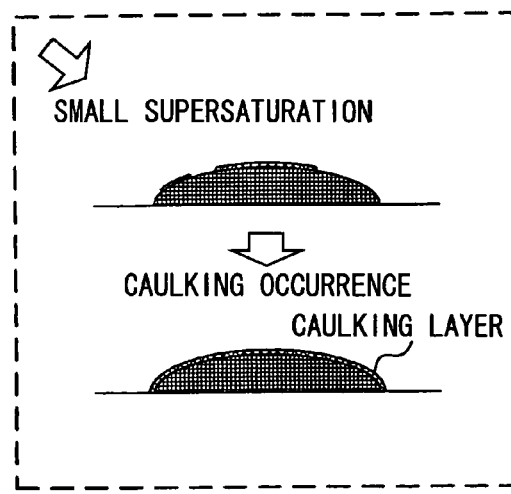
Figure 2C:
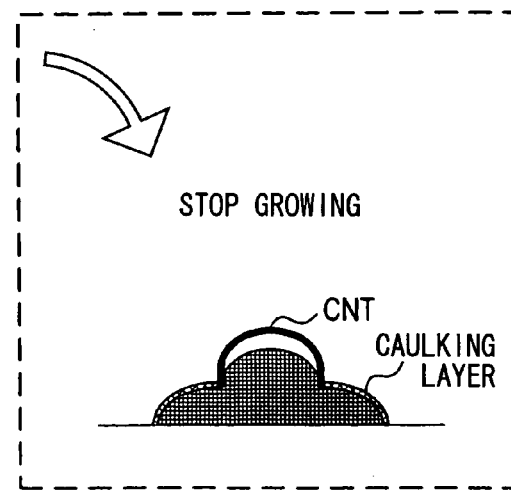

However, when the supply amount of carbon is larger than a predetermined value, as shown in FIG. 2C, the amount of carbon atoms introduced into the catalyzer is larger than the required amount of carbon atoms that is used for formation of the CNT. Therefore, excess carbon atoms separates out on the surface of the catalyzer, thereby, a caulking layer is formed on the catalyzer. The caulking layer prevents the carbon atoms from being introduced into the catalyzer, so that the growth of the CNT stops.

In FIG. 1, the supply amount of carbon to the catalyzer is reduced after the cap layer is formed on the catalyzer. In this case, the caulking layer is prevented from being formed. Thus, for example, by controlling the raw material gas concentration with respect to a process time, the CNT having a large length can be obtained.

When the raw material gas concentration is low from the initial stage of growth, as shown in FIG. 2B, since the catalyzer does not become large super saturation in the initial stage of growth, the cap layer is not formed on the catalyzer. However, the caulking layer is formed on the catalyzer so that the surface of the catalyzer is covered with the caulking layer. Thus, a caulking state begins. Accordingly, a CNT film having high quality is not formed on the catalyzer.

(First Embodiment)

A method for manufacturing the carbon nano tube according to a first embodiment will be explained as follows. Specifically, the CNT is formed on a substrate by a CVD method. The CNT is vertically oriented on the surface of the substrate.

Figure 3:
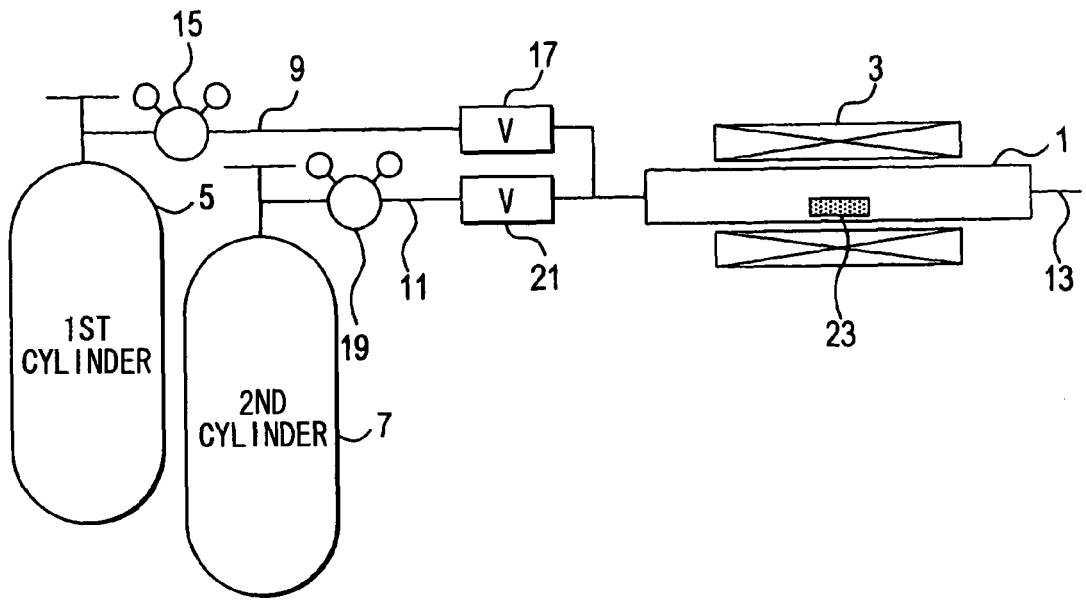
FIG. 3 is a schematic view showing a manufacturing device of the CNT according to a first embodiment.

A CNT manufacturing device is shown in FIG. 3. The device includes a reactor tube 1, a heater 3, a first cylinder 5, a second gas cylinder 7, a first supply pipe 9, a second supply pipe 11 and an emission pipe 13. In the reactor tube 1, a vertically oriented carbon nano tube is manufactured by the CVD method. The heater 3 as a ring shaped electric furnace is arranged around the reactor tube 1 so that the heater 3 heats the inside of the reactor tube 1. The first cylinder 5 supplies raw material gas such as ethylene gas as a carbon source. The second cylinder 7 supplies carrier gas such as argon gas. The first supply pipe 9 transports the raw material gas to the reactor tube 1. The second supply pipe 11 transports the carrier gas to the reactor tube 1. The emission pipe 13 discharges residual gas from the reactor tube 1 after the raw material gas and the carrier gas are used for reaction.

A first pressure reducing valve 15 and a first flow control valve 17 as a mass flow controller are arranged on an upstream side of the first supply pipe 9. A second pressure reducing valve 19 and a second flow control valve 21 are arranged on an upstream side of the second supply pipe 11.

A substrate 23 made of a silicon wafer is arranged in the reactor tube 1 in a horizontal position. A catalyzer for growing a carbon nano tube is disposed on the surface of the substrate 23. The catalyzer is, for example, made of iron (i.e, Fe), and deposited on the surface of the substrate 23 by a sputtering method. The thickness of the catalyzer is 3 nm.

A method for manufacturing the CNT will be explained as follows.

Figure 4A:
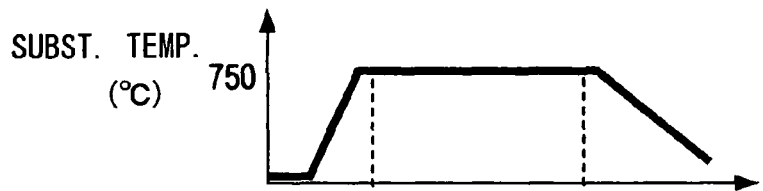
FIG. 4A is a graph showing a control profile of substrate temperature.
Figure 4B:
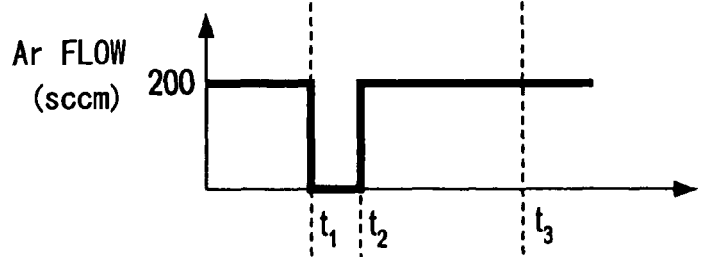
FIG. 4B is a graph showing a control profile of Ar gas flow.
Figure 4C:
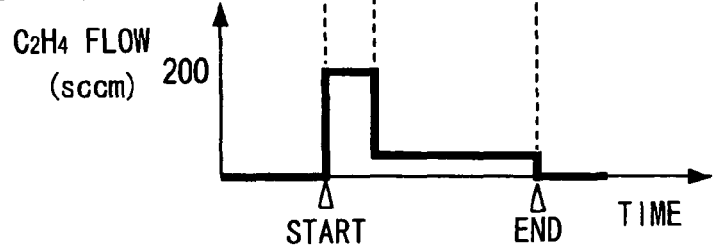
FIG. 4C is a graph showing a control profile of ethylene gas flow, according to the first embodiment.

As shown in FIGS. 4A to 4C, the argon gas is flown in the reactor tube 1 with a flow rate of 200 sccm (i.e., standard cubic centimeters per minute). A process temperature, i.e., a substrate temperature, in the reactor tube 1 is increased to 750° C. by the heater 3. Here, the unit of sccm represents the flow rate at 25° C. under 1 atm.

Then, at the time t1, the argon gas supply is stopped, and further, the ethylene gas supply begins. Specifically, the ethylene gas is supplied with a gas flow rate of 200 sccm. The ethylene gas supply continues from the time t1 to the time t2. For example, the ethylene gas is supplied for ten seconds.

At the time t2, the ethylene gas supply is reduced from 200 sccm to 10 sccm. Further, the argon gas supply begins so that the argon gas is supplied with the gas flow rate of 200 sccm. The argon gas supply with 200 sccm and the ethylene gas supply with 10 sccm continue from the time t2 to the time t3. For example, the ethylene gas and the argon gas are supplied for ten minutes. At the time t3, the ethylene gas supply is stopped so that synthesis of the CNT ends.

Thus, the CNT having the length of about two millimeters is formed on the substrate 23.

In this embodiment, in the initial process of CNT synthesis for ten seconds from the beginning of ethylene gas supply, i.e., from the beginning of CNT synthesis, a large amount of ethylene gas is supplied so that the amount of carbon to be introduced in the catalyzer increases. Then, the ethylene gas supply is reduced lower than one-tenth of the initial supply so that the amount of carbon to be introduced in the catalyzer decreases. Thus, the CNT having large length is formed easily.

Alternatively, in the initial process of CNT synthesis, the ethylene gas having high concentration may be supplied to the catalyzer, and then, the concentration of the ethylene gas may be reduced.

(Second Embodiment)

Figure 5A:
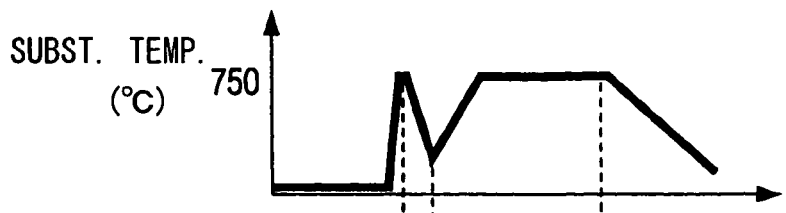
FIG. 5A is a graph showing a control profile of substrate temperature.
Figure 5B:
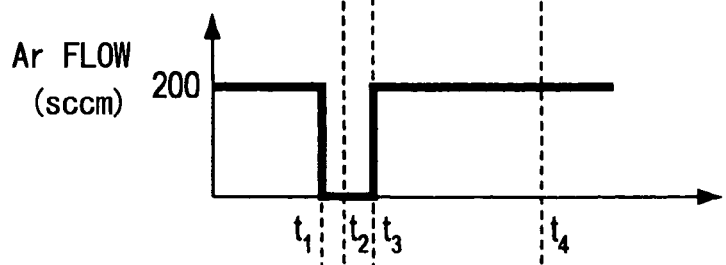
FIG. 5B is a graph showing a control profile of Ar gas flow.
Figure 5C:
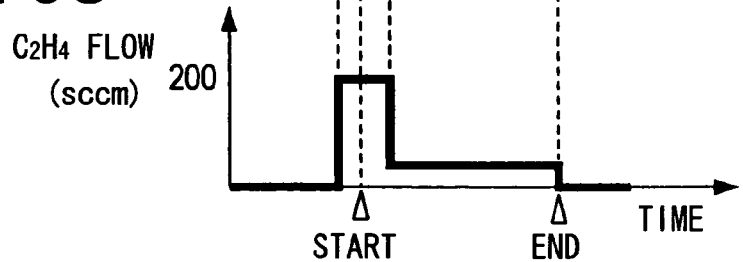
FIG. 5C is a graph showing a control profile of ethylene gas flow, according to a second embodiment.

A method for manufacturing the CNT will be explained according to a second embodiment. As shown in FIGS. 5A to 5C, the argon gas is supplied into the reactor tube 1 with a gas flow rate of 200 sccm so that the atmosphere in the reactor tube 1 is exchanged to the argon gas. Then, the argon gas supply is stopped from the time t1 to the time t3. From the time t3, the argon gas is supplied again with the gas flow rate of 200 sccm.

From the time t1 to the time t3, the ethylene gas is supplied with the gas flow rate of 200 sccm. From the time t3 to the time t4, the ethylene gas is supplied with the gas flow rate of 100 sccm. Then, at the time t4, the ethylene gas supply is stopped.

Further, at the time t1, the heater 3 starts to heat the inside of the reactor tube 1 rapidly so that the substrate temperature immediately reaches a synthesis temperature, i.e., 750° C. Specifically, the heater 3 heats the tube 1 rapidly so that the temperature of the tube 1 is increased with temperature increase rate of 200° C. per minute. Then, when the temperature reaches 750° C. at the time t2, the temperature of the tube 1 is decreased to 200° C. with temperature decrease rate of 200° C. per minute. Then, when the temperature reaches 200° C. at the time t3, the temperature of the tube 1 is increased to 750° C. with temperature increase rate of 100° C. per minute. Then, when the temperature reaches 750° C., the temperature of the tube 1 is maintained at 750° C. until the time t4. At the time t4, the ethylene gas supply is stopped so that the CNT synthesis ends. Thus, the CNT is formed.

Thus, the CNT having the length of about one millimeter is formed on the substrate 23. In this embodiment, the CNT having a large length is formed easily. Further, when the ethylene gas supply is increased, the substrate temperature is also increased. Accordingly, the carbon amount to be introduced into the catalyzer is increased so that the growth speed of the CNT is increased. The CNT is formed rapidly. Further-more, when the ethylene gas supply is reduced, the substrate temperature is reduced. Accordingly, the caulking layer is prevented from being formed.

(Third Embodiment)

In a third embodiment, the gas supply is controlled in accordance with a growth condition of the CNT.

Figure 6:
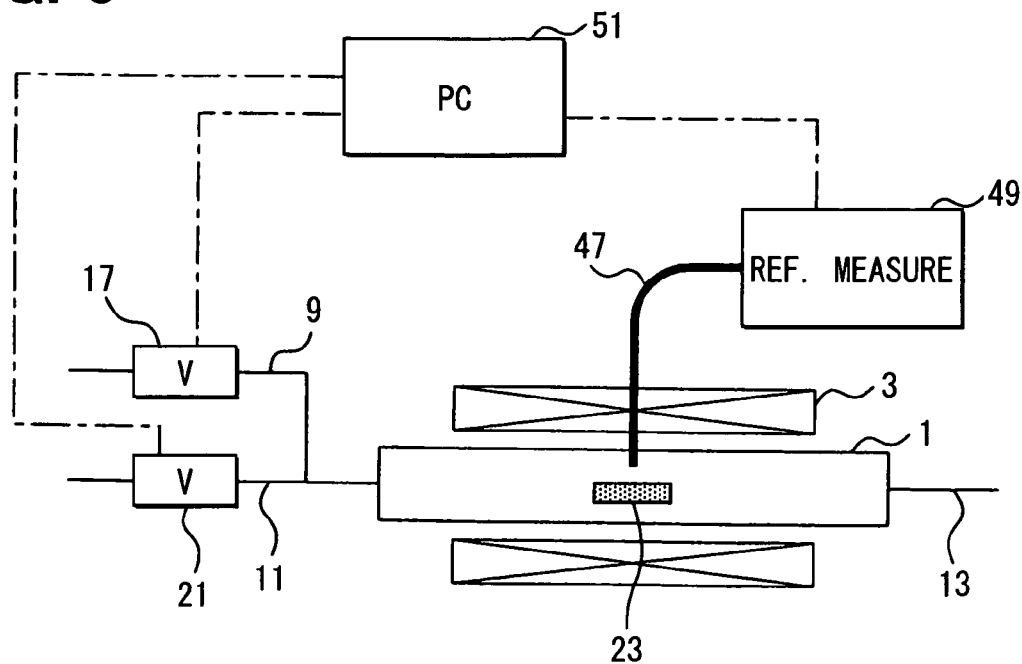
FIG. 6 is a schematic view showing a manufacturing device of the CNT according to a third embodiment.

A CNT manufacturing device according to the present embodiment is shown in FIG. 6. The device includes the reactor tube 1, the heater 3, the first supply pipe 9, the second supply pipe 11, the first flow control valve 17, the second flow control valve 21 and the emission pipe 13. In the reactor tube 1, the substrate 23 having the catalyzer is disposed.

Further, the device includes an optical fiber 47, a reflectivity measurement element 49 and a personal computer 51. The optical fiber 47 made of quartz and having heat resistance is arranged to be adjacent to the catalyzer so that the state of the catalyzer is observable from above the substrate 23. The fiber 47 is connected to the reflectivity measurement element 49 so that the reflectivity of the surface of the substrate 23 is measured.

The personal computer 51 as an electronic controller controls operation of the device. The computer 51 is coupled with the reflectivity measurement element 49, and the first and second flow control valves 17, 21, respectively.

In this embodiment, the substrate temperature, the argon gas flow rate and the ethylene gas flow rate are controlled independently. The timing of controlling them is different from that in the first embodiment.

Specifically, the reflectivity of the substrate surface on which the catyalyzer is supported is measured by the reflectivity measurement element 49, i.e., the reflectivity of the substrate surface on which the CNT is grown is measured. Based on a measured data of the substrate surface, the first and second flow control valves 17,21 are controlled by the computer 51.

As shown in FIG. 4, in the initial synthesis process, the argon gas is flown in the reactor tube 1 with a flow rate of 200 sccm. The substrate temperature in the reactor tube 1 is increased to 750° C. by the heater 3. At the time t1, the argon gas supply is stopped, and further, the ethylene gas is supplied with a gas flow rate of 200 sccm. The ethylene gas supply continues from the time t1. From the time t1, the reflectivity of the substrate surface is measured so that a change rate of the reflectivity corresponding to a growth speed of the CNT is obtained. When the change rate of the reflectivity is reduced to be lower than 10% of the change rate of the reflectivity at the beginning of the growth, the argon gas flow rate is set to be 200 sccm, and the ethylene gas flow rate is set to be 10 sccm. This time is defined as the time t2.

The argon gas supply with 200 sccm and the ethylene gas supply with 10 sccm continue from the time t2 to the time t3. At the time t3, the ethylene gas supply is stopped so that synthesis of the CNT ends.

Thus, the CNT having large length is formed easily. Further, the computer 51 controls the argon gas flow and the ethylene gas flow so that the timing of controlling each gas flow is optimized. Accordingly, the CNT is effectively formed.

In this embodiment, the gas flow is controlled based on the change rate of the reflectivity. Alternatively, the gas flow may be controlled based on the reflectivity. Specifically, when the reflectivity is changed to a predetermined value, the timing for switching the gas flow may be determined.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a carbon nano tube by a CVD method comprising:

forming a catalyzer on a substrate, wherein the carbon nano tube is formed with using the catalyzer:

arranging the substrate with the catalyzer in a reactor;

heating the substrate to be a synthesis temperature;

supplying a raw material gas into the reactor, the raw material gas providing a carbon supply source;

measuring a reflectivity on a surface of the substrate;

supplying a carrier gas into the reactor; and controlling at least one of a concentration and a flow rate of the raw material gas, wherein the controlling at least one of the concentration and the flow rate includes:

setting the concentration to a first concentration or setting the flow rate to a first flow rate at a first step of synthesis of the carbon nano tube; and setting the concentration to a second concentration or setting the flow rate to a second flow rate at a second step of synthesis of the carbon nano tube, the second concentration is smaller than the first concentration, and the second flow rate is smaller than the first flow rate, and the second step is performed after the first step, wherein the catalyzer becomes super saturated in the first step of synthesis of the carbon nano tube, and a caulking layer is prevented from being formed on the catalyzer in the second step of synthesis of the carbon nano tube, wherein the first step is an initial step from a beginning of synthesis to a predetermined time, the controlling at least one of the concentration and the flow rate further includes switching the first step to the second step when a change rate of the reflectivity of the substrate becomes equal to or lower than one-tenth the change rate of the reflectivity of the substrate at the beginning of synthesis, and the synthesis temperature is 750° C., the raw material gas is ethylene gas, and the second concentration is smaller than one-tenth the first concentration, and the second flow rate is smaller than one-tenth the first flow rate.

* * * * *